United States Patent
Lee et al.

(10) Patent No.: US 11,024,748 B2
(45) Date of Patent: Jun. 1, 2021

(54) NONVOLATILE MEMORY DEVICE INCLUDING TWO-DIMENSIONAL MATERIAL AND APPARATUS INCLUDING THE NONVOLATILE MEMORY DEVICE

(71) Applicant: Samsung Electronics Co., Ltd., Suwon-si, Gyeonggi-do (KR)

(72) Inventors: Jaeho Lee, Seoul (KR); Haeryong Kim, Seongnam-si (KR); Sanghyun Jo, Seoul (KR); Hyeonjin Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 112 days.

(21) Appl. No.: 15/892,850

(22) Filed: Feb. 9, 2018

(65) Prior Publication Data

US 2018/0358470 A1    Dec. 13, 2018

(30) Foreign Application Priority Data

Jun. 12, 2017 (KR) .......................... 10-2017-0073287

(51) Int. Cl.
*H01L 29/788* (2006.01)
*H01L 29/423* (2006.01)
(Continued)

(52) U.S. Cl.
CPC .......... *H01L 29/7887* (2013.01); *G11C 11/54* (2013.01); *G11C 11/56* (2013.01);
(Continued)

(58) Field of Classification Search
CPC ............... H01L 29/7887; H01L 29/788; H01L 27/11521
See application file for complete search history.

(56) References Cited

U.S. PATENT DOCUMENTS 5,273,910 A * 12/1993 Tran ...................... H01L 27/146
257/E27.13
9,525,076 B2   12/2016 Lee et al.
(Continued)

FOREIGN PATENT DOCUMENTS

CN       103996681 A    8/2014
EP         2767505 A1    8/2014
(Continued)

OTHER PUBLICATIONS

"Nonvolatile Memory Cells Based on MoS2/Graphene Heterostructures," Simone Bertolazzi, Dada Krasnozhon, and Andras Kis, ACS Nano, vol. 7, No. 4, 2013, pp. 3246-3252. (Year: 2013).*
(Continued)

*Primary Examiner* — John A Bodnar
(74) *Attorney, Agent, or Firm* — Harness, Dickey & Pierce, P.L.C.

(57) ABSTRACT

Provided are nonvolatile memory devices including 2-dimensional (2D) material and apparatuses including the nonvolatile memory devices. A nonvolatile memory device may include a storage stack including a plurality of charge storage layers between a channel element and a gate electrode facing the channel element. The plurality of charge storage layers may include a 2D material. An interlayer barrier layer may be further provided between the plurality of charge storage layers. The nonvolatile memory device may have a multi-bit or multi-level memory characteristic due to the plurality of charge storage layers.

23 Claims, 17 Drawing Sheets

(51) Int. Cl.
*H01L 29/49* (2006.01)
*H01L 27/11521* (2017.01)
*G11C 11/54* (2006.01)
*G11C 11/56* (2006.01)
*H01L 29/786* (2006.01)
*H01L 29/06* (2006.01)
*G11C 13/02* (2006.01)
*H01L 21/28* (2006.01)
*G11C 16/04* (2006.01)
*G11C 16/26* (2006.01)
*G11C 16/10* (2006.01)
*B82Y 10/00* (2011.01)

(52) U.S. Cl.
CPC ...... *G11C 11/5621* (2013.01); *G11C 11/5628* (2013.01); *G11C 11/5642* (2013.01); *G11C 13/025* (2013.01); *H01L 27/11521* (2013.01); *H01L 29/0673* (2013.01); *H01L 29/40114* (2019.08); *H01L 29/42324* (2013.01); *H01L 29/42332* (2013.01); *H01L 29/49* (2013.01); *H01L 29/78684* (2013.01); *H01L 29/78687* (2013.01); *B82Y 10/00* (2013.01); *G11C 16/0441* (2013.01); *G11C 16/10* (2013.01); *G11C 16/26* (2013.01); *G11C 2211/5612* (2013.01); *G11C 2213/35* (2013.01)

(56) References Cited

U.S. PATENT DOCUMENTS

| | | | |
|---|---|---|---|
| 9,583,639 | B2 | 2/2017 | Lee et al. |
| 2001/0015456 | A1* | 8/2001 | Bui .................. H01L 29/511 257/324 |
| 2006/0054943 | A1 | 3/2006 | Li et al. |
| 2008/0067577 | A1* | 3/2008 | Wang ................. G11C 11/5671 257/321 |
| 2010/0283097 | A1 | 11/2010 | Endoh et al. |
| 2014/0231820 | A1 | 8/2014 | Lee et al. |
| 2015/0014630 | A1* | 1/2015 | Choi .................. H01L 29/6603 257/24 |
| 2015/0028278 | A1* | 1/2015 | Lee ...................... H01L 45/085 257/2 |
| 2016/0268418 | A1* | 9/2016 | Lee ...................... H01L 45/085 |

FOREIGN PATENT DOCUMENTS

| | | | |
|---|---|---|---|
| KR | 2013-0007062 | A | 1/2013 |
| KR | 2013-0016595 | A | 2/2013 |
| KR | 10-1357849 | B1 | 2/2014 |
| KR | 20140102991 | A | 8/2014 |

OTHER PUBLICATIONS

"Nonvolatile Floating-gate Memories Based on Stacked Black Phosphorus-Boron Nitride-MoS2 Heterostructures," Dong Li et al., Adv. Funct. Mater. 2015, 25, 7360-7365 (Year: 2015).*

"Anisotropic Photocurrent Response at Black Phosphorus-MoS2 p-n Heterojunctions," Tu Hong et al., Nanoscale, 2015, 7, 18537-18541 (Year: 2015).*

"Nonvolatile Memory Cells Based on MoS2/Graphene Heterostructures," Simone Bertolazzi, Daria Krasnozhon, and Andras Kis, ACS Nano, vol. 7, No. 4, 2013, pp. 3246-3252 (Year: 2013).*

"Thickness Scaling Effect on Interfacial Barrier and Electrical Contact to Two-Dimensional MoS2 Layers," Song-Lin Li et al.,, ACS Nano, vol. 8, No. 12, p. 12836-12842, Dec. 3, 2014 (Year: 2014).*

Bertolazzi, S. et al., "Nonvolatile Memory Cells Based on MoS$^2$/Graphene Heterostructures," ACSNano, vol. 7, No. 4, Apr. 2013, pp. 3246-3252.

Novikov, Y. et al., "Multilayer Graphene-Based Flash Memory," Russian Microelectronics, vol. 45, No. 1, Jan. 2016, pp. 63-67.

Toshiba, "Nand Flash Memory," Jun. 2016.

Extended European Search Report for EP Appl. No. 18158704.9 dated Jul. 20, 2018.

L. Britnell et al., "Field-Effect Tunneling Transistor Based on Vertical Graphene Heterostructures", Science vol. 335, dated Feb. 24, 2012.

He Tian et al "A Dynamically Reconfigurable Ambipolar Black Phosphorus Memory Device", ACS Publications, dated Oct. 29, 2016.

Quoc an Vu et al., "Two-terminal floating-gate memory with van der Weals heterostructures for ultrahigh on/off ratio", Nature Communications, dated Sep. 2, 2016.

Office Action dated Dec. 20, 2019, issued in corresponding European Patent Application No. 18158704.9.

Dong Li et al., 'Nonvolatile Floating-Gate Memories Based on Stacked Black Phosphorus-Boron Nitride-MoS2 Heterostructures'*Advanced Functional Materials*, vol. 25, No. 47, pp. 7360-7365, Nov. 2015.

\* cited by examiner

< Program "10" >
$V_G > V_{PGM1} > V_C$

< Retention "10" >
$V_G = V_C$

< Program "11" >
$V_G > V_{PGM2}$

< Retention "11" >
$V_G = V_C$

< Erase >
$V_G \ll V_C$

NONVOLATILE MEMORY DEVICE INCLUDING TWO-DIMENSIONAL MATERIAL AND APPARATUS INCLUDING THE NONVOLATILE MEMORY DEVICE

CROSS-REFERENCE TO RELATED APPLICATION

This application claims the benefit of Korean Patent Application No. 10-2017-0073287, filed on Jun. 12, 2017, in the Korean Intellectual Property Office, the disclosure of which is incorporated herein in its entirety by reference.

BACKGROUND

1. Field

The present disclosure relates to a nonvolatile memory device and an apparatus including the same.

2. Description of Related Art

Data may be recorded, changed, or deleted in a nonvolatile memory device by adjusting charges in a material, resistance, or spin states of electrons. Phase-change random access memory (PRAM) and resistive RAM (RRAM) that operate based on a resistance change via a state change of a material or current path formation and magnetic RAM (MRAM) that operates based on a magnetic spin state are two-terminal devices and operate by being connected to an external transistor. Flash memory, which may store data by filling charges in a floating gate or removing charges from the floating gate, is a three-terminal device.

In general, a nonvolatile memory device may be a single-bit memory device including a data storage layer that has one of two states (0 or 1). Since increasing data integration and storage density is limited in the case of a single-bit memory device, a multi-bit memory device capable of storing data of a plurality of bits in one memory cell needs to be developed. However, in this case, various issues may arise, such as increase of an operation voltage and power consumption, deterioration of discrimination with respect to each data state, and issues related to device operating principles. Accordingly, it is difficult to realize a multi-bit memory device, and in particular, it may be more difficult to realize a device having a memory characteristic of 3-bit or more.

SUMMARY

Provided are nonvolatile memory devices having multi-bit or multi-level memory characteristics.

Provided are nonvolatile memory devices having excellent discrimination with respect to a plurality of pieces of data.

Provided are nonvolatile memory devices capable of realizing data memory characteristics of 3-bit or more.

Provided are multi-bit nonvolatile memory devices including a 2-dimensional (2D) material.

Provided are apparatuses, circuits, and systems including the nonvolatile memory devices.

Provided are operating methods of the nonvolatile memory devices.

Additional aspects will be set forth in part in the description which follows and, in part, will be apparent from the description, or may be learned by practice of the presented embodiments.

According to some example embodiments, a nonvolatile memory device may include a channel element; a source and a drain electrically each connected to the channel element and spaced apart from each other; a gate electrode facing the channel element; and a storage stack between the channel element and the gate electrode. The storage stack may include a plurality of charge storage layers spaced apart from each other from the channel element towards the gate electrode. Each of the plurality of charge storage layers may include a 2-dimensional (2D) material. The nonvolatile memory device may be configured to have a multi-bit memory characteristic due to the plurality of charge storage layers.

In some example embodiments, the 2D material may include graphene.

In some example embodiments, each of the plurality of charge storage layers may include 1 to 20 layers of graphene.

In some example embodiments, the nonvolatile memory device may further include a channel barrier layer between the channel element and the storage stack and an interlayer barrier layer between the plurality of charge storage layers.

In some example embodiments, a dielectric constant of the channel barrier layer may be smaller than a dielectric constant of the interlayer barrier layer.

In some example embodiments, the channel barrier layer may have a dielectric constant of 6 or higher.

In some example embodiments, a thickness of the channel barrier layer may be greater than a thickness of the interlayer barrier layer.

In some example embodiments, the storage stack may further include an interlayer barrier layer between the plurality of charge storage layers. The interlayer barrier layer may include a material having an energy band gap.

In some example embodiments, the interlayer barrier layer may include a semiconductor or an insulator.

In some example embodiments, the interlayer barrier layer may include a 2D semiconductor or a 2D insulator.

In some example embodiments, the storage stack may include a plurality of interlayer barrier layers between the plurality of charge storage layers. The plurality of interlayer barrier layers may include the material having an energy band gap. Thicknesses of the plurality of interlayer barrier layers may decrease from the channel element towards the gate electrode.

In some example embodiments, at least two of the plurality of charge storage layers may have different thicknesses.

In some example embodiments, thicknesses of the plurality of charge storage layers may decrease from the channel element towards the gate electrode.

In some example embodiments, thicknesses of the plurality of charge storage layers may increase from the channel element towards the gate electrode.

In some example embodiments, intervals between the plurality of charge storage layers may decrease from the channel element towards the gate electrode.

In some example embodiments, the nonvolatile memory device may further include a gate insulating layer between the storage stack and the gate electrode.

In some example embodiments, the multi-bit memory characteristic of the nonvolatile memory device may be 3-bit or more.

In some example embodiments, the nonvolatile memory device may have a 6-level or higher multi-level memory characteristic.

In some example embodiments, the nonvolatile memory device may have a vertical-NAND memory structure.

According to some example embodiments, a synapse device includes the nonvolatile memory device.

In some example embodiments, the synapse device may include a pre-synaptic neuron circuit and a post-synaptic neuron circuit, a gate electrode of the nonvolatile memory device may be connected to the pre-synaptic neuron circuit, and a source of the nonvolatile memory device may be connected to the post-synaptic neuron circuit.

In some example embodiments, the synapse device may include a plurality of nonvolatile memory devices. The plurality of nonvolatile memory devices may include the nonvolatile memory device and other nonvolatile memory devices corresponding to the nonvolatile memory device. The plurality of nonvolatile memory devices may be arranged in a plurality of rows and a plurality of columns.

In some example embodiments, the synapse device may further include a plurality of first wirings and a plurality of second wirings crossing the plurality of first wirings. The plurality of nonvolatile memory devices may be respectively located at intersections of the plurality of first wirings and the plurality of second wirings.

In some example embodiments, the synapse device may include a pre-synaptic neuron circuit and a post-synaptic neuron circuit, the plurality of first wirings may be connected to the pre-synaptic neuron circuit, and the plurality of second wirings may be connected to the post-synaptic neuron circuit.

According to some example embodiments, a neuromorphic device includes the synapse device.

In some example embodiments, the neuromorphic device may further include a complementary metal-oxide-semiconductor (CMOS) neuron circuit connected to the synapse device.

According to some example embodiments, a nonvolatile memory device may include a channel element, a gate electrode connected to the channel element and facing the channel element, a source and a drain electrically each connected to the channel element and spaced apart from each other, and a storage stack between the channel element and the gate electrode. The storage stack may include a plurality of interlayer barrier layers separating a plurality of charge storage layers from each other. Each of the plurality of charge storage layers may include a 2-dimensional (2D) material. The plurality of charge storage layers be electrically insulating from the source and the drain. The nonvolatile memory device may be configured to have a multi-bit memory characteristic due to the plurality of charge storage layers.

In some example embodiments, the nonvolatile memory device may further include a gate insulating layer between the storage stack and the gate electrode.

In some example embodiments, the 2D material may be graphene.

In some example embodiments, a width of the gate electrode may be different than a width of the channel element.

In some example embodiments, the nonvolatile memory device may further include a channel barrier layer between the storage stack and the channel element.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
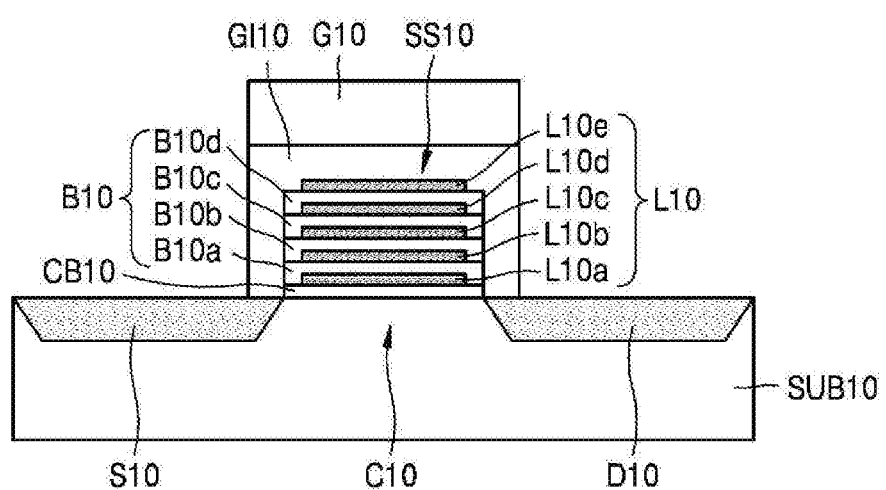
FIG. 1 is a cross-sectional view of a nonvolatile memory device including a 2-dimensional (2D) material, according to an embodiment.

Various example embodiments will now be described more fully with reference to the accompanying drawings in which some example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

FIG. 1 is a cross-sectional view of a nonvolatile memory device including a 2-dimensional (2D) material, according to an embodiment.

Referring to FIG. 1, the nonvolatile memory device may include a channel element C10, a source S10, and a drain D10. The source S10 and the drain D10 are electrically connected to the channel element C10. The source S10 may be electrically connected to or may electrically contact a first region of the channel element C10, and the drain D10 may be electrically connected to or may electrically contact a second region of the channel element C10. The channel element C10, the source S10, and the drain D10 may be provided in a substrate SUB10. The source S10 and the drain D10 may be formed by injecting impurities into different regions of the substrate SUB10, and a region of the substrate SUB10 between the source S10 and the drain D10 may be defined as the channel element (channel region) C10. The substrate SUB10 may be, for example, a silicon (Si) substrate, but may alternatively be a substrate including a material other than Si, such as germanium (Ge), SiGe, or a group III-V semiconductor. A material of the substrate SUB10 is not limited thereto and may vary.

A gate electrode G10 may be provided to face the channel element C10. The gate electrode G10 may be spaced apart from the channel element C10, between the source S10 and the drain D10. A storage stack SS10 may be provided between the channel element C10 and the gate electrode G10. The storage stack SS10 may include a plurality of charge storage layers L10 spaced apart from each other from the channel element C10 towards the gate electrode G10. The plurality of charge storage layers L10 may include a 2D material. The plurality of charge storage layers L10 may be an electrically floating element. According to an embodiment, the plurality of charge storage layers L10 may not be electrically connected to the source S10, the drain D10, and the gate electrode G10, and may be in a floating state. The plurality of charge storage layers L10 may be an element that traps charges. Accordingly, the plurality of charge storage layers L10 may be a charge trapping layer. Each of the plurality of charge storage layers L10 may be one memory layer. Each of the plurality of charge storage layers L10 may store data corresponding to 1-bit or 1-level based on charge storage (trapping). Accordingly, the nonvolatile memory device may have a multi-bit or multi-level memory characteristic due to use of the plurality of charge storage layers L10.

The plurality of charge storage layers L10 may include a 2D material. The 2D material is a single-layer or half-layer solid in which atoms form a particular crystalline structure. The 2D material may have a 2D crystalline structure. The 2D material that may be included in the plurality of charge storage layers L10 may have electric conductivity and also have a charge storing (trapping) characteristic. According to an embodiment, the 2D material may be graphene. Graphene is a single layer (monoatomic layer) structure in which carton atoms form a hexagonal structure. Each of the plurality of charge storage layers L10 may include graphene in a single layer or a plurality of layers. According to an embodiment, each of the plurality of charge storage layers L10 may include 1 to 20 layers of graphene or 1 to 15 layers of graphene. Since the 2D material, such as graphene, has a small density of state (DOS), a work function and a Fermi level may be largely changed just by storing a small amount of charges. Accordingly, by storing charges in at least one of the plurality of charge storage layers L10, a threshold voltage of the nonvolatile memory device may be largely changed. As a result, a multi-level (multi-bit) memory device having excellent performance may be easily realized. Accordingly, a memory device having excellent identification characteristic with respect to multi-level (multi-bit) data and operable by storing only a small amount of charges may be realized. Also, when the plurality of charge storage layers L10 include the 2D material, a total thickness of the storage stack SS10 may be relatively small, and thus, the nonvolatile memory device may be advantageous in terms of data writing/erasing operations, operating voltage, power consumption, etc.

The storage stack SS10 may further include an interlayer barrier layer B10 provided between the plurality of charge storage layers L10. When there are three or more charge storage layers L10, a plurality of the interlayer barrier layers B10 may be used. When there are two charge storage layers L10, one interlayer barrier layer B10 may be used. In FIG. 1, five charge storage layers, e.g., first through fifth charge storage layers L10a through L10e, and four interlayer barrier layers, e.g., first through fourth interlayer barrier layers B10a through B10d, are illustrated, but the numbers of the charge storage layers L10 and interlayer barrier layers B10 may vary. Two or more charge storage layers L10 and one or more interlayer barrier layers B10 may be used.

The interlayer barrier layer B10 may include a material having an energy bandgap. According to an embodiment, the energy bandgap of the interlayer barrier layer B10 may have a value greater than 0 eV. For example, the energy bandgap of the interlayer barrier layer B10 may be greater than about 1.0 eV (or 2.0 eV). The interlayer barrier layer B10 may include a semiconductor or an insulator (dielectric substance) having an energy bandgap. The semiconductor may be a 2D semiconductor or may be a general semiconductor material other than a 2D material (semiconductor). The insulator may be a 2D insulator or may be a general insulator material other than a 2D material (insulator). The 2D semiconductor may include, for example, a metal chalcogenide-based material. The metal chalcogenide-based material may include a transition metal dichalcogenide (TMDC) material. The metal chalcogenide-based material may include a metal element from among molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), and lead (Pb), and a chalcogen element from among sulfur (S), selenium (Se), and tellurium (Te). For example, the metal chalcogenide-based material may be $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, GaS, or GaSe. The 2D insulator may include, for example, hexagonal boron nitride (h-BN). A thickness of each of the interlayer barrier layers B10 may be about 15 nm. However, according to another embodiment, the thickness of each of the interlayer barrier layers B10 may be greater than 15 nm. When the interlayer barrier layer B10 includes a 2D semiconductor or a 2D insulator, the total thickness of the storage stack SS10 may be relatively low, and thus, the nonvolatile memory device may be advantageous in terms of data writing/erasing operations, operating voltage, power consumption, etc. However, a material of the interlayer barrier layer B10 is not limited thereto and may vary. According to an embodiment, the interlayer barrier layer B10 may include polymer. The interlayer barrier layer B10 described above may be a tunneling barrier layer.

The nonvolatile memory device may further include a channel barrier layer CB10 provided between the channel element C10 and the storage stack SS10. The channel barrier layer CB10 may be provided between the channel element C10 and the first charge storage layer L10a. A dielectric constant of the channel barrier layer CB10 may be smaller than that of the interlayer barrier layer B10. According to an embodiment, the channel barrier layer CB10 may include a material having a smaller dielectric constant than the interlayer barrier layer B10. In this case, a height of an energy barrier formed by the channel barrier layer CB10 may be higher than a height of an energy barrier formed by each of the first through fourth interlayer barrier layers B10a through B10d. A dielectric constant of the channel barrier layer CB10 may be equal to that of the interlayer barrier layer B10. In this case, a thickness of the channel barrier layer CB10 may be greater than that of each of the interlayer barrier layers B10. Accordingly, a charge transfer through each of the interlayer barrier layers B10 may be facilitated compared to a charge transfer through the channel barrier layer CB10. Also, the channel barrier layer CB10 may include a dielectric material (insulating material) having a dielectric constant of about 6 or more. In this case, the operating voltage of the nonvolatile memory device may be suitably reduced. In order to reduce the operating voltage to a suitable level, the dielectric constant of the channel barrier layer CB10 may be adjusted to about 6 or more. A thickness of the channel barrier layer CB10 may be determined to be several tens of nm or less (e.g., 70 nm or less, 30 nm or less).

A gate insulating layer GI10 may be further provided between the storage stack SS10 and the gate electrode G10. The gate insulating layer GI10 may limit and/or prevent charges (for example, electrons) from escaping from the storage stack SS10 to the gate electrode G10. In this regard, the gate insulating layer GI10 may be referred to as a blocking insulating layer. A thickness of the gate insulating layer GI10 may be greater than that of the channel barrier layer CB10. According to an embodiment, the thickness of the gate insulating layer GI10 may be several tens of nm or greater (e.g., 30 nm or more). The gate insulating layer GI10 may cover a top surface and a side surface of the storage stack SS10.

The nonvolatile memory device may be referred to as a 'nonvolatile memory transistor'. The nonvolatile memory device may be one memory cell. The number of bits of levels of data to be stored in the nonvolatile memory device may be determined based on the number of charge storage layers L10 in the nonvolatile memory device. By increasing the number of charge storage layers L10, a device having a multi-bit (multi-level) memory characteristic of a high order, such as a 2-bit, 3-bit, 4-bit, or 5-bit, may be realized. The plurality of charge storage layers L10 may include the 2D material (for example, graphene), and in this case, since the DOS of the 2D material (for example, graphene) is small, the work function and the Fermi level may be largely changed by just storing a small amount of charges. Accordingly, a multi-bit (multi-level) memory device having excellent performance may be easily realized. In particular, a device having a multi-bit memory characteristic of at least 3-bit or at least 5-bit or a device having a multi-level memory characteristic of at least 6-level may be realized. Also, the operating voltage and the power consumption may be controlled by suitably controlling the material/thickness of the interlayer barrier layer B10 and the material/thickness of the channel barrier layer CB10.

Figure 2A:
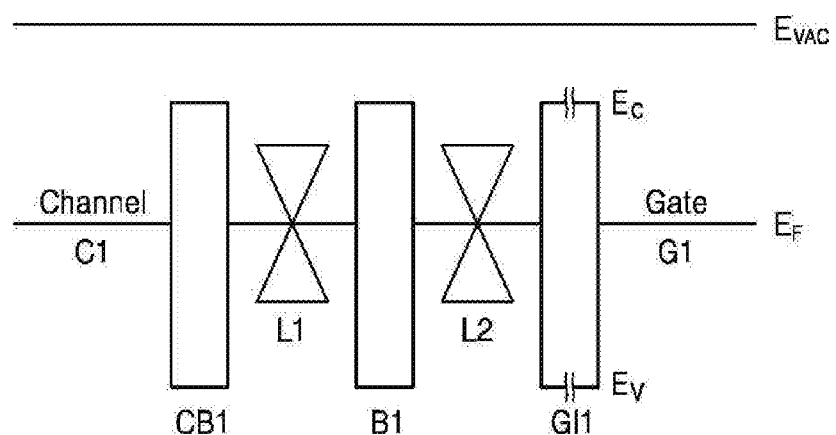
FIGS. 2A through 2F are energy band diagrams for describing an operating of a nonvolatile memory device, according to an embodiment.

FIG. 2A is an energy band diagram in an initial state (equilibrium state) of a nonvolatile memory device, according to an embodiment. In this case, two charge storage layers, e.g., first and second charge storage layers L1 and L2, and an interlayer barrier layer B1 therebetween are used. A reference numeral C1 denotes a channel element, a reference numeral CB1 denotes a channel barrier layer, a reference numeral GI1 denotes a gate insulating layer, and a reference numeral G1 denotes a gate electrode. Reference numerals EV and EC respectively denote a valence band maximum energy level and a conduction band minimum energy level, a reference numeral EF denotes a Fermi energy level, and a reference numeral $E_{VAC}$ denotes a vacuum energy level. The same reference numerals are used in FIGS. 2B through 2F.

Referring to FIG. 2A, in the initial state, the Fermi energy levels EF of the channel element C1, the first charge storage layer L1, the second charge storage layer L2, and the gate electrode G1 are the same. At this time, a gate voltage $V_G$ and a channel voltage $V_C$ may be the same. For example, when a voltage is not applied to the gate electrode G1 and the channel element C1, an initial state may correspond to data "00".

Figure 2B:
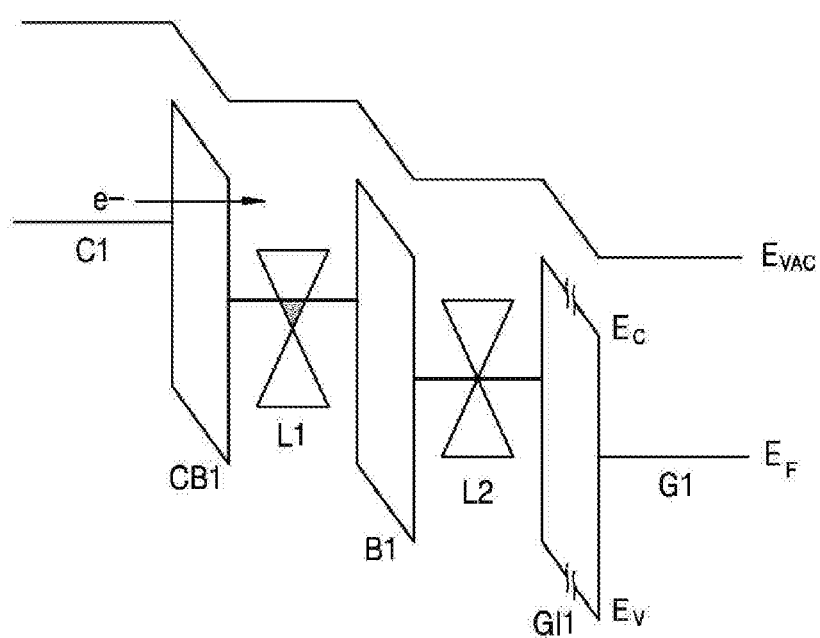
Figure 2C:
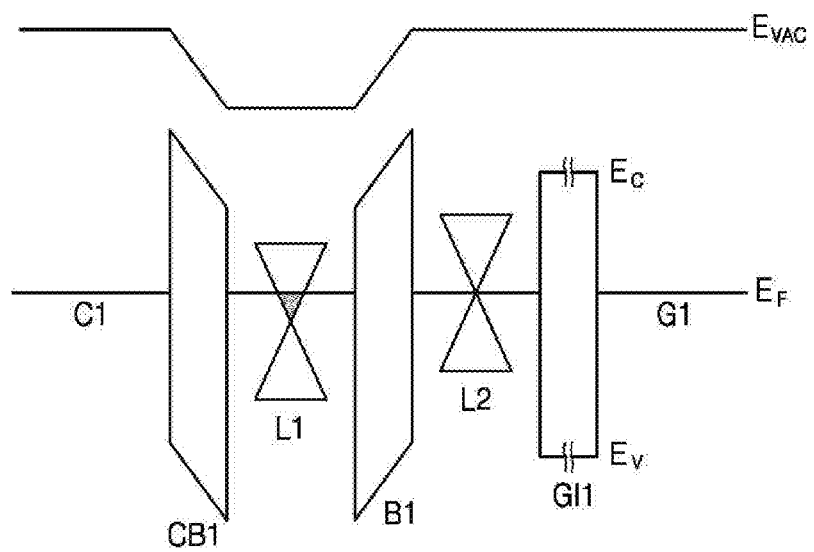
Figure 2D:
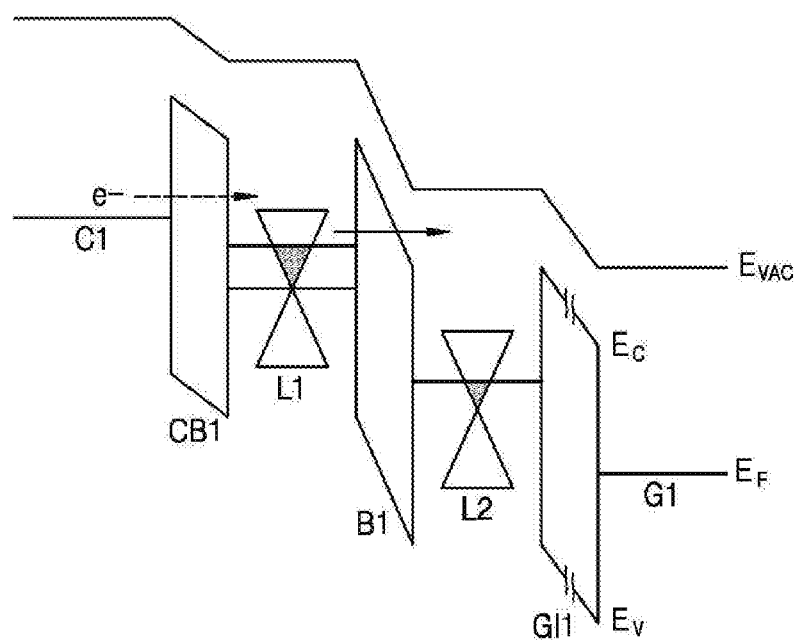
Figure 2E:
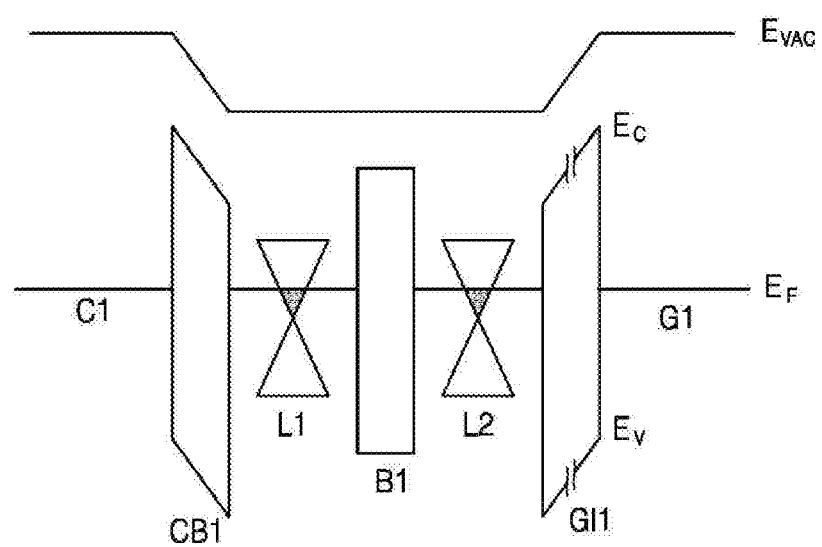

FIGS. 2B through 2E are energy band diagrams for describing an operating method of the nonvolatile memory device of FIG. 2A. FIG. 2B shows a method of programming data "10", FIG. 2C shows a state in which data "10" is retained, FIG. 2D shows a method of programming data "11", and FIG. 2E shows a state in which data "11" is retained.

In FIG. 2B, when a first programming voltage $V_{PGM1}$ is applied to the nonvolatile memory device, charges (electrons) may be stored (trapped) in the first charge storage layer L1. Such an operation may be an operation of recording the data "10". The data "10" may be retained as shown in FIG. 2C. For example, the data "10" may be retained when the gate voltage $V_G$ and the channel voltage $V_C$ may be the same.

In FIG. 2D, when a second programming voltage $V_{PGM2}$ is applied to the nonvolatile memory device, charges (electrons) may be stored (trapped) in the second charge storage layer L2. Accordingly, the charges (electrons) may be stored (trapped) in the first and second charge storage layers L1 and L2. Such an operation may be an operation of recording the data "11". The data "11" may be retained as shown in FIG. 2E.

Figure 2F:
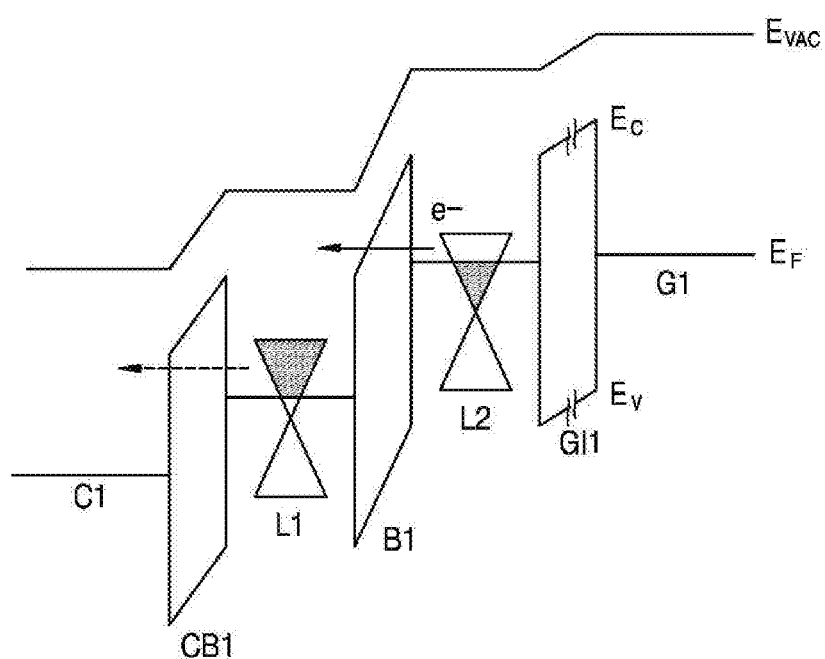

FIG. 2F is an energy band diagram for describing a method of erasing data of the nonvolatile memory device described with reference to FIGS. 2A through 2E.

Referring to FIG. 2F, when a high voltage is applied to the channel element C1, e.g., when the channel voltage $V_C$ is considerably higher than the gate voltage $V_G$, an energy band changes and the charges (electrons) stored in the first and second charge storage layers L1 and L2 may escape to the channel element C1. Thus, the charges of the first charge storage layer L1 may move to the channel element C1, the charges of the second charge storage layer L2 may move to the first charge storage layer L1, this state corresponds to data "10", and then the charges of the first charge storage layer L1 may move to the channel element C1, this state corresponds to data "00".

An operating method of a memory device using two charge storage layers, e.g., the first and second charge storage layers L1 and L2, is described with reference to FIGS. 2A through 2F, but inventive concepts are not limited thereto. The number of charge storage layers may be 3 or more, and an energy band diagram may variously change.

Figure 3:
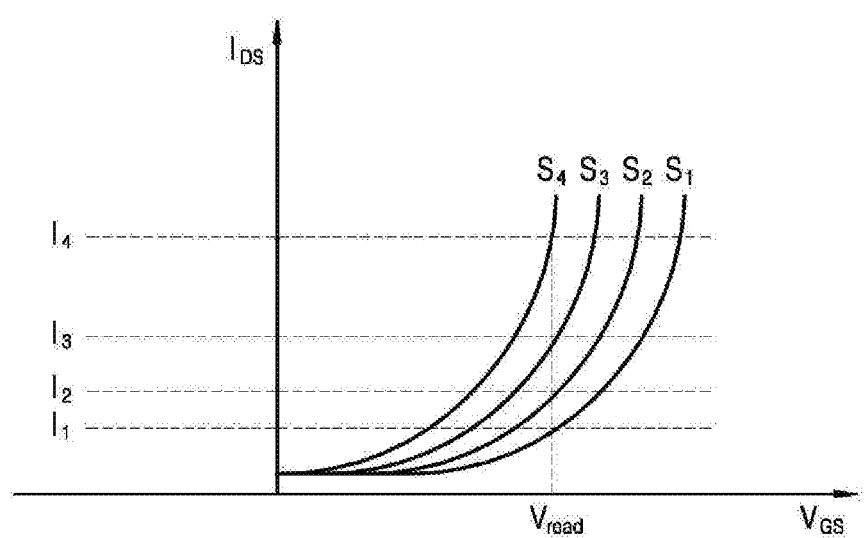
FIG. 3 is a graph of a threshold voltage according to states of a nonvolatile memory device, according to an embodiment.

FIG. 3 is a graph of a threshold voltage according to states (programming) of a nonvolatile memory device, according to an embodiment.

Referring to FIG. 3, the nonvolatile memory device may have a plurality of states S1 through S4 based on charge storage of a plurality of charge storage layers. The nonvolatile memory device may have different threshold values in the plurality of states S1 through S4. In other words, the threshold voltage may change according to the states of the nonvolatile memory device. Accordingly, a plurality of currents I1 through I4 that are distinctively distinguished at a certain read voltage Vread may be detected. Here, four states are illustrated and described, but the number of charge storage layers may be increased to easily realize five or more states.

When one charge storage layer is either in a 0 or 1 state (e.g., in one of two states), the number of pieces of data realizable according to the number of charge storage layers may be as follows. For example, when the number of charge storage layers is 3, the pieces of realizable data may be 4, e.g., 000, 100, 110, and 111. Such realizable data may be multi-level data of 4 levels. When the number of charge storage layers is 5, the pieces of realizable data may be 6, e.g., 00000, 10000, 11000, 11100, 11110, and 11111. Such realizable data may be multi-level data of 6 levels. When the number of charge storage layers is 7, the pieces of realizable data may be 8, e.g., 0000000, 1000000, 1100000, 1110000, 1111000, 1111100, 1111110, and 1111111. Such realizable data may be multi-level data of 8 levels. When the number of charge storage layers is 9, the pieces of realizable data may be 10, e.g., 000000000, 100000000, 110000000, 111000000, 111100000, 111110000, 111111000, 111111100, 111111110, and 111111111. Such realizable data may be multi-level data of 10 levels. By increasing the number of charge storage layers, multi-level data of 16 levels or higher may be realized.

According to circumstances, one charge storage layer may be in one of three or more states based on an amount of charges stored in the one charge storage layer. For example, one charge storage layer may be in one of three states, e.g., states of 0, 0.5, and 1, or in one of a plurality of states, e.g., states of 0, 1, 2, and 3. As such, when one charge storage layer is in one of three or more states, the pieces of data realizable via a combination of a plurality of charge storage layers may largely increase. Accordingly, a memory device of a multi-level or a multi-bit may be easily realized.

Figure 4:
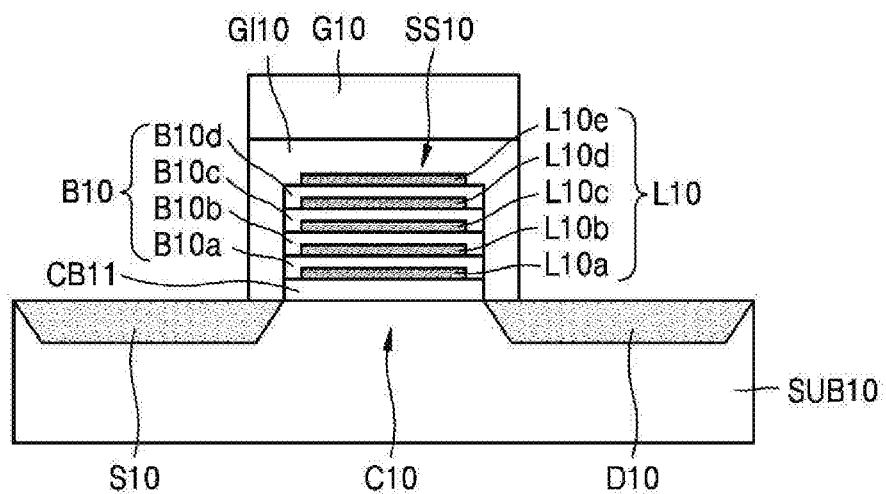
FIG. 4 is a cross-sectional view of a nonvolatile memory device including a 2D material, according to another embodiment.

FIG. 4 is a cross-sectional view of a nonvolatile memory device including a 2D material, according to another embodiment. In the current embodiment, a thickness of a channel barrier layer CB11 is adjusted.

Referring to FIG. 4, the thickness of the channel barrier layer CB11 may be greater than that of each of the interlayer barrier layers B10. Here, a dielectric constant of the channel barrier layer CB11 may be equal to or similar to that of the interlayer barrier layer B10. The thicknesses of the first through fourth interlayer barrier layers B10a through B10d may be the same or substantially the same. When the thickness of the channel barrier layer CB11 is great, a charge transfer through each of the interlayer barrier layer B10 may be relatively easier than a charge transfer through the channel barrier layer CB11.

Figure 5:
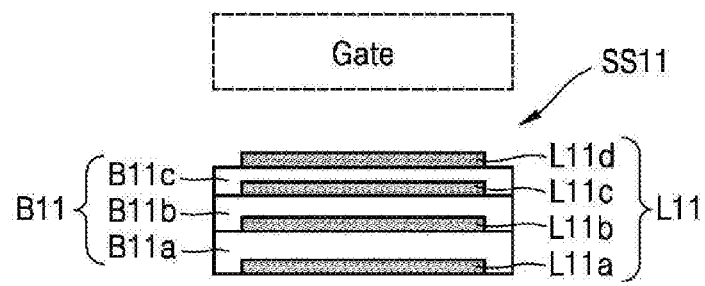
FIG. 5 is a cross-sectional view of a storage stack applicable to a nonvolatile memory device, according to another embodiment.

FIG. 5 is a cross-sectional view of a storage stack SS11 applicable to a nonvolatile memory device, according to another embodiment.

Referring to FIG. 5, the storage stack SS11 may include a plurality of charge storage layers L11 and an interlayer barrier layer B11 provided between the plurality of charge storage layers L11. Here, the plurality of charge storage layers L11 include first through fourth charge storage layers L11a through L11d, and the interlayer barrier layer B11 includes first through third interlayer barrier layers B11$a$ through B11$c$. The first through fourth charge storage layers L11$a$ through L11$d$ may include a 2D material, for example, graphene. Thicknesses of the first through third interlayer barrier layers B11$a$ through B11$c$ may gradually decrease from a channel element (not shown) towards a gate electrode Gate. The thickness of each of the first through third interlayer barrier layers B11$a$ through B11$c$ denotes a thickness (e.g., an effective thickness) of a corresponding interlayer barrier layer (for example, the first interlayer barrier layer B11$a$) between two adjacent charge storage layers (for example, the first and second charge storage layers L11$a$ and L11$b$). Accordingly, the thickness of the corresponding interlayer barrier layer (for example, the first interlayer barrier layer B11$a$) may correspond to an 'interval' between the two adjacent charge storage layers (for example, the first and second charge storage layers L11$a$ and L11$b$). The same applies to each of the first through third interlayer barrier layers B12$a$ through B12$c$ and each of the first through third interlayer barrier layers B13$a$ through B13$c$ respectively shown in FIGS. 6 and 7.

As in the current embodiment, when the thicknesses of the first through third interlayer barrier layers B11$a$ through B11$c$ decrease towards the gate electrode Gate, a data recording operation may be easily performed on the plurality of charge storage layers L11. When charges are to be stored in the second charge storage layer L11$b$ after charges are stored in the first charge storage layer L11$a$, such a storing operation may be affected by the thickness of the first interlayer barrier layer B11$a$. Similarly, when charges are to be stored in the third charge storage layer L11$c$ after charges are stored in the second charge storage layer L11$b$, such a storing operation may be affected by the thickness of the second interlayer barrier layer B11$b$. Since the thickness of the second interlayer barrier layer B11$b$ is smaller than the thickness of the first interlayer barrier layer B11$a$, an operation of storing charges in the third charge storage layer L11$c$ (e.g., an operation of recording data) may be easily performed. Similarly, since the thickness of the third interlayer barrier layer B11$c$ is smaller than the thickness of the second interlayer barrier layer B11$b$, an operation of storing charges in the fourth charge storage layer L11$d$ (e.g., an operation of recording data) may be easily performed.

Figure 6:
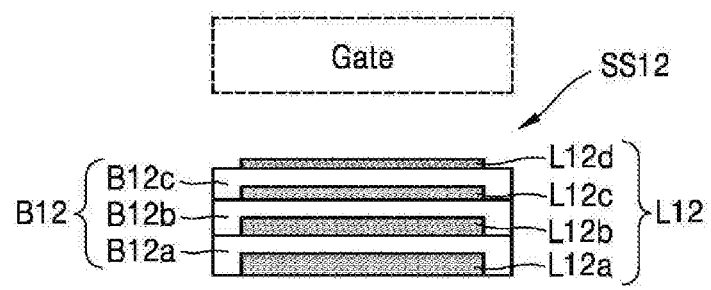
FIG. 6 is a cross-sectional view of a storage stack applicable to a nonvolatile memory device, according to another embodiment.

FIG. 6 is a cross-sectional view of a storage stack SS12 applicable to a nonvolatile memory device, according to another embodiment.

Referring to FIG. 6, the storage stack SS12 may include a plurality of charge storage layers L12 and an interlayer barrier layer B12 provided between the plurality of charge storage layers L12. Here, first through third interlayer barrier layers B12$a$ through B12$c$ are provided between first through fourth charge storage layers L12$a$ through L12$d$. The first through fourth charge storage layers L12$a$ through L12$d$ may include a 2D material, such as graphene. Thicknesses of the first through fourth charge storage layers L12$a$ through L12$d$ may gradually decrease from a channel element (not shown) towards the gate electrode Gate. Accordingly, the number of graphene sheets (stacked graphene sheets) included in the first through fourth charge storage layers L12$a$ through L12$d$ may decrease towards the gate electrode Gate.

As in the current embodiment, when the thicknesses of the first through fourth charge storage layers L12$a$ through L12$d$ decrease towards the gate electrode Gate, a data recording operation may be easily performed on the charge storage layers L12. Charges may be stored in the second charge storage layer L12$b$ after storing charges in the first charge storage layer L12$a$. Here, since the thickness of the second charge storage layer L12$b$ is smaller than that of the first charge storage layer L12$a$, an operation of storing charges in the second charge storage layer L12$b$ (e.g., an operation of recording data) may be easily performed. Similarly, since the thickness of the third charge storage layer L12$c$ is smaller than that of the second charge storage layer L12$b$, and the thickness of the fourth charge storage layer L12$d$ is smaller than that of the third charge storage layer L12$c$, an operation of sequentially storing charges in the third and fourth charge storage layers L12$c$ and L12$d$ (e.g., an operation of recording data) may be easily performed.

Figure 7:
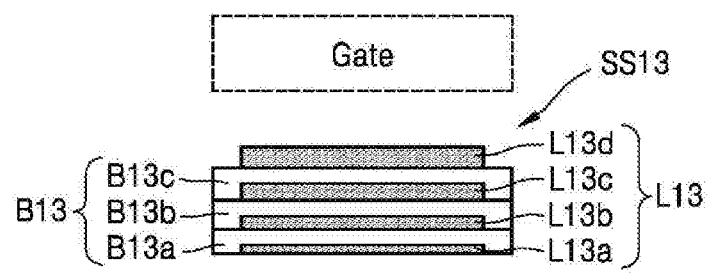
FIG. 7 is a cross-sectional view of a storage stack applicable to a nonvolatile memory device, according to another embodiment.

FIG. 7 is a cross-sectional view of a storage stack SS13 applicable to a nonvolatile memory device, according to another embodiment.

Referring to FIG. 7, the storage stack SS13 may include a plurality of charge storage layers L13 and an interlayer barrier layer B13 provided between the plurality of charge storage layers L13. Here, first through fourth charge storage layers L13$a$ through L13$d$ and first through third interlayer barrier layers B13$a$ through B13$c$ provided therebetween are illustrated. The first through fourth charge storage layers L13$a$ through L13$d$ may include a 2D material, such as graphene. Thicknesses of the first through fourth charge storage layers L13$a$ through L13$d$ may gradually increase from a channel element (not shown) towards the gate electrode Gate. Accordingly, the number of graphene sheets (stacked graphene sheets) included in the first through fourth charge storage layers L13$a$ through L13$d$ may increase towards the gate electrode Gate.

As in the current embodiment, when the thicknesses of the first through fourth charge storage layers L13$a$ through L13$d$ increase towards the gate electrode Gate, a data erasing operation may be more easily performed on the plurality of charge storage layers L13. For example, when an operation of removing charges of the first charge storage layer L13$a$ (e.g., a data erasing operation) is to be performed while charges are stored only in the first charge storage layer L13$a$ and are not stored in the second through fourth charge storage layers L13$b$ through L13$d$, since the thickness of the first charge storage layer L13$a$ is small, the operation of removing charges from the first charge storage layer L13$a$ may be easily performed. Similarly, when operations of removing charges of the first and second charge storage layers L13$a$ and L13$b$ (e.g., data erasing operations) are to be performed while charges are stored in the first and second charge storage layers L13$a$ and L13$b$ and are not stored in third and fourth charge storage layers L13$c$ and L13$d$, since the thicknesses of the first and second charge storage layers L13$a$ and L13$b$ are small, the operations of removing charges from the first and second charge storage layers L13$a$ and L13$b$ may be easily performed. Also, although not described herein, various effects may be achieved when the thicknesses of the plurality of charge storage layers L13 increase towards the gate electrode Gate.

Thickness changing characteristics of the plurality of interlayer barrier layers B11 described with reference to FIG. 5 may be the same as the thickness changing characteristics of the plurality of interlayer barrier layers B12 and the plurality of interlayer barrier layers B13 in the embodiments of FIGS. 6 and 7, respectively. Also, unlike FIG. 5, the thicknesses of the plurality of interlayer barrier layers B11 may increase towards the gate electrode Gate, and such a feature may be the same in the embodiments of FIGS. 6 and 7. Various combinations are possible based on functions and purposes of a device. Also, in FIGS. 5 through 7, four charge storage layers and three interlayer barrier layers are shown, but the numbers thereof may vary.

Figure 8:
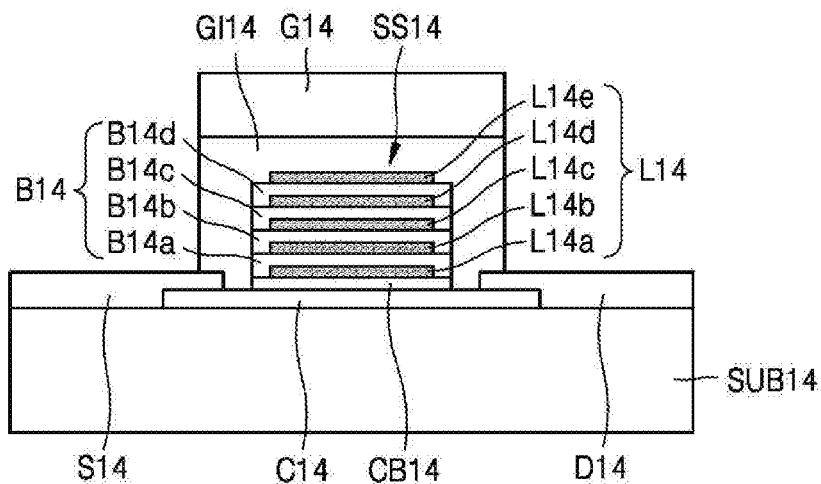
FIG. 8 is a cross-sectional view of a nonvolatile memory device including a 2D material, according to another embodiment.

In FIG. 1, the channel element C10 is provided in the substrate SUB10 and the source S10 and the drain D10 are provided respectively on two sides of the channel element C10, but according to another embodiment, a separate channel layer (channel element) may be provided on a substrate as shown in FIG. 8.

FIG. 8 is a cross-sectional view of a nonvolatile memory device including a 2D material, according to another embodiment.

Referring to FIG. 8, a channel layer C14 may be provided on a substrate SUB14. The channel layer C14 may include a 2d material, such as graphene or transition metal dichalcogenide (TMDC). When the channel layer C14 includes graphene, the channel layer C14 may include graphene in a sheet shape or in a certain patterned shape. Alternatively, the channel layer C14 may include a general semiconductor material other than a 2D material. Alternatively, the channel layer C14 may include a carbon-based nanomaterial, such as carbon nanotube (CNT), or an organic semiconductor material.

A source electrode S14 and a drain electrode D14, which are electrically connected to each other, may be provided in different regions of the channel layer C14. The source electrode S14 may be provided on a first end portion of the channel layer C14 and the drain electrode D14 may be provided on a second end portion of the channel layer C14. The source and drain electrodes S14 and D14 may be formed of a conductive material, such as a metal, a metal compound, or conductive polymer.

A storage stack SS14 may be provided on a region of the channel layer C14 between the source electrode S14 and the drain electrode D14. The storage stack SS14 may be the same as or similar to the storage stack SS10 described with reference to FIG. 1. The storage stack SS14 may include a plurality of charge storage layers L14 and an interlayer barrier layer B14 provided therebetween. For example, the storage stack SS14 may include a plurality of charge storage layers L14*a* through L14*e* and a plurality of interlayer barrier layers B14*a* through B14*d*. A channel barrier layer CB14 may be further provided between the channel layer C14 and the storage stack SS14. A gate insulating layer GI14 may cover the storage stack SS14, and a gate electrode G14 may be provided on the gate insulating layer GI14. The channel barrier layer CB14, the gate insulating layer GI14, and the gate electrode G14 may be the same as or similar to those described with reference to FIG. 1.

As in the current embodiment, when the channel layer C14, the source electrode S14, and the drain electrode D14 are provided on the substrate SUB14, various materials may be applied thereto. Also, a material applicable to the substrate SUB14 may vary. Accordingly, various devices, such as a flexible device and a foldable device, may be easily realized.

Figure 9:
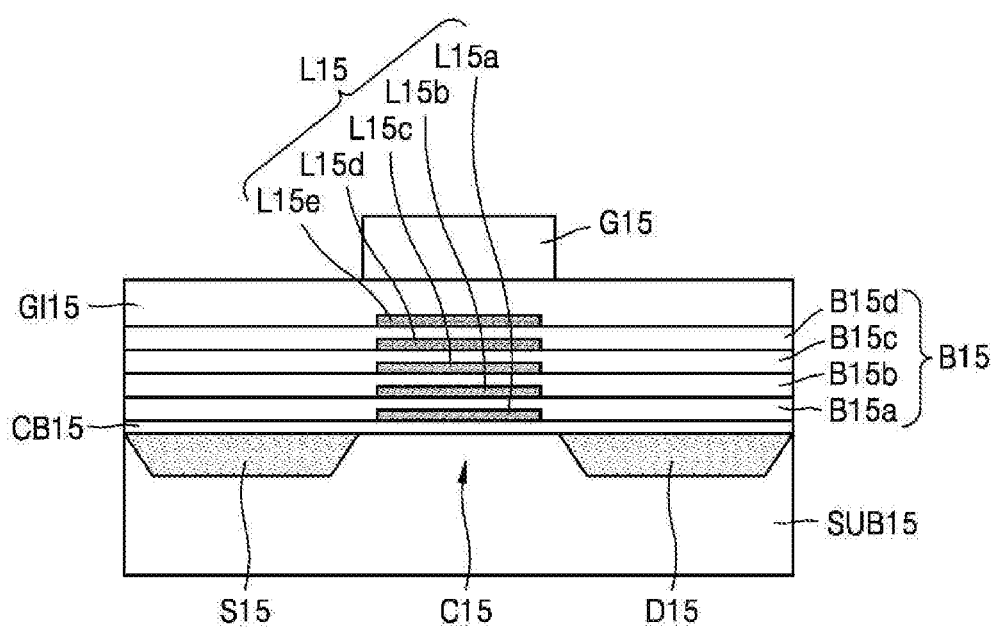
FIG. 9 is a cross-sectional view of a nonvolatile memory device including a 2D material, according to another embodiment.

FIG. 9 is a cross-sectional view of a nonvolatile memory device including a 2D material, according to another embodiment.

Referring to FIG. 9, a source S15 and a drain D15 may be formed on different regions of a substrate SUB15, and a channel element (channel region) C15 may be provided between the source and drains D15 and D15. A plurality of charge storage layers L15 may be sequentially provided on the channel element C15, and an interlayer barrier layer B15 may be provided between the plurality of charge storage layers L15. For example, the plurality of charge storage layers L15 may include first through fifth charge storage layers L15*a* through L15*e*, and the interlayer barrier layer B15 may include first through fourth interlayer barrier layers B15*a* through B15*d*. A channel barrier layer CB15 may be further provided between the first charge storage layer L15*a* and the channel element C15. A gate insulating layer GI15 covering the fifth charge storage layer L15*e* may be provided on the fourth interlayer barrier layer B15*d*, and a gate electrode G15 may be provided on the gate insulating layer GI15.

In the current embodiment, the channel barrier layer CB15 may extend to cover not only the channel element C15, but also the source S15 and the drain D15. The channel barrier layer CB15 may entirely cover a top surface of the substrate SUB15. Similarly, the first through fourth interlayer barrier layers B15*a* through B15*d* may also have an extending layer structure. Also, the gate insulating layer GI15 may also have an extending layer structure. The current embodiment is a modification of the embodiment of FIG. 1. Also, in FIG. 9, at least two of the first through fourth interlayer barrier layers B15*a* through B15*d* may include different materials from each other. In other words, one layer of the first through fourth interlayer barrier layers B15*a* through B15*d* may include a first material and another layer of the first through fourth interlayer barrier layers B15*a* through B15*d* may includes a second material which is different from the first material, for example.

Figure 10:
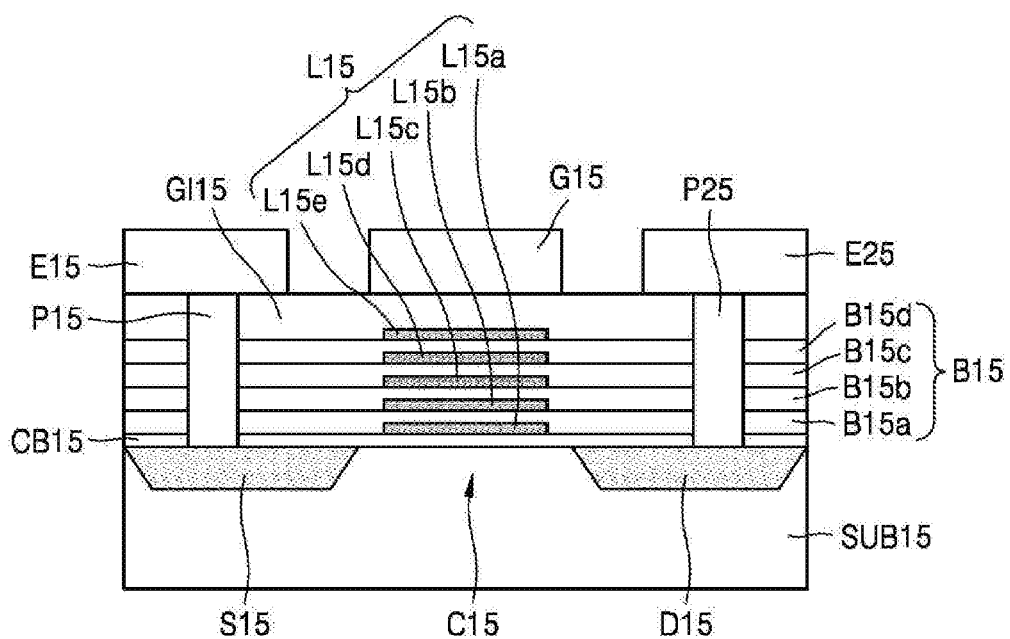
FIG. 10 is a cross-sectional view of a nonvolatile memory device including a 2D material, according to another embodiment.

As shown in FIG. 9, a first contact electrode connected to the source S15 and a second contact electrode connected to the drain D15 may be further provided on the gate insulating layer GI15 as shown in FIG. 10.

FIG. 10 is a cross-sectional view of a nonvolatile memory device including a 2D material, according to another embodiment.

Referring to FIG. 10, a first contact electrode E15 connected to the source S15 and a second contact electrode E25 connected to the drain D15 may be further provided on the gate insulating layer GI15. The source S15 and the first contact electrode E15 may be connected via a first conductive plug P15, and the drain D15 and the second contact electrode E25 may be connected via a second conductive plug P25. The first and second conductive plugs P15 and P25 may be provided inside contact holes formed through the gate insulating layer GI15, the interlayer barrier layer B15, and the channel barrier layer CB15. The first and second electrode E15 and E25 and the first and second conductive plugs P15 and P25 may be formed of a conductive material (e.g., metal, metal alloy).

Figure 11:
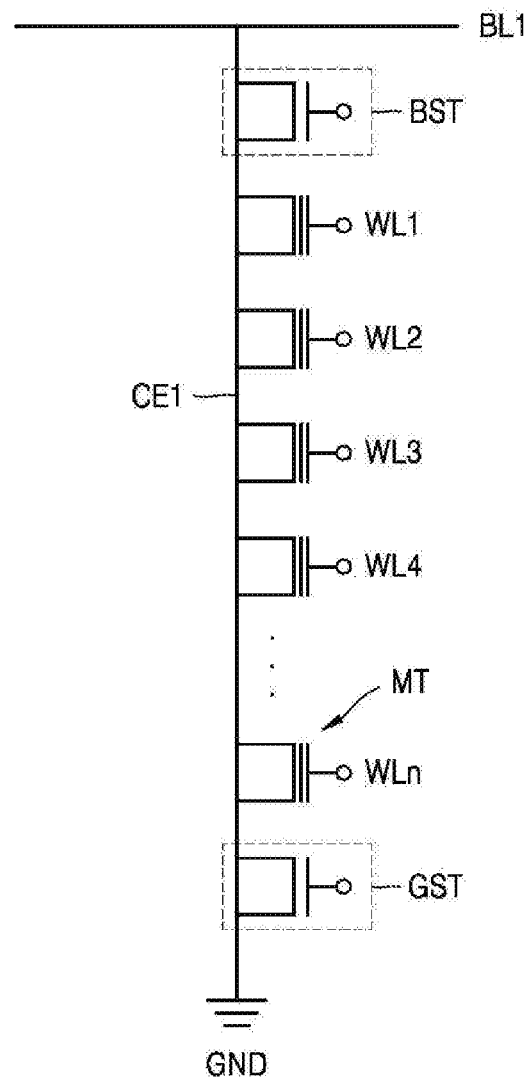
FIG. 11 is a circuit diagram of a nonvolatile memory device according to an embodiment.

FIG. 11 is a circuit diagram of a nonvolatile memory device according to an embodiment. In the current embodiment, the nonvolatile memory device has a vertical-NAND (V-NAND) memory structure.

Referring to FIG. 11, a channel element CE1 extending in a direction perpendicular to a substrate (not shown) may be provided, and a plurality of memory transistors MT may be provided at the channel element CE1. The plurality of memory transistors MT may have a device structure described with reference to FIGS. 1 through 10. Word lines WL1 through WLn may be respectively connected to the plurality of memory transistors MT.

One end of the channel element CE1 may be connected to a ground GND, and another end of the channel element CE1 may be connected to a bit line BL1. The bit line BL1 may extend in a direction perpendicular to the channel element CE1. A bit line selection transistor BST may be further provided between the channel element CE1 and the bit line BL1. A ground selection transistor GST may be further provided between the channel element CE1 and the ground GND.

When the channel element CE1 is formed in a direction perpendicular to the substrate and the plurality of memory transistors MT are provided at a side of the channel element CE1, data density and integration may be easily increased. Here, one channel element CE1 is illustrated, but in an actual device, an array of a plurality of channel elements may be provided, and a plurality of memory transistors may be provided at each of the channel elements.

The V-NAND memory structure shown in FIG. 11 is only an example, and thus may vary. Also, the nonvolatile memory device has the V-NAND memory structure in FIG. 11, but may alternatively have a horizontal NAND memory structure in which a plurality of memory transistors are provided in a direction parallel to a substrate. Since the horizontal NAND memory structure is similar to a general NAND structure, details thereof are not provided here.

Figure 12:
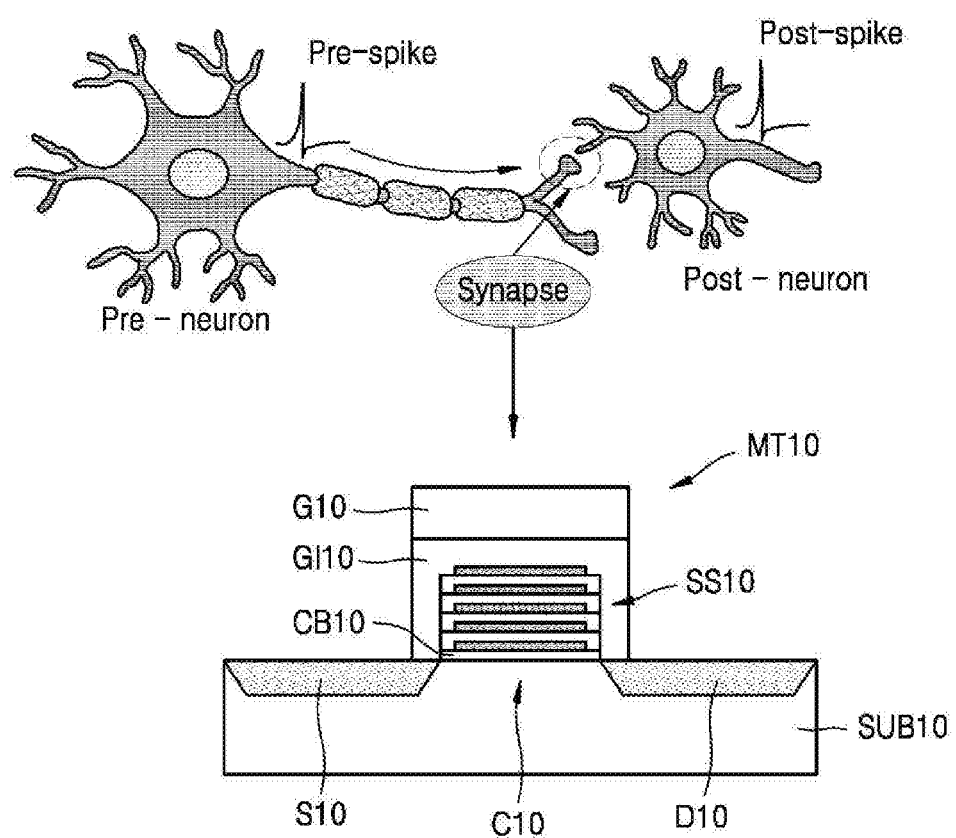
FIG. 12 is a conceptual diagram illustrating a case of applying a nonvolatile memory device (memory transistor) according to an embodiment to a synapse device.

FIG. 12 is a conceptual diagram illustrating a case of applying a nonvolatile memory transistor MT10 according to an embodiment to a synapse device. The nonvolatile memory transistor MT10 may have, for example, a structure of FIG. 1, but is not limited thereto and may alternatively have a structure according to one of nonvolatile memory devices in one of FIGS. 4 to 10.

Referring to FIG. 12, when a synapse that is a junction between a pre-neuron and a post-neuron is configured in a circuit, the nonvolatile memory transistor MT10 according to the present embodiment may be employed. The pre-neuron may input a pre-spike signal to a synapse. The synapse may transfer a certain synaptic signal to the post-neuron. The post-neuron may generate a post-spike signal. Similar to the synapse connecting the pre-neuron and the post-neuron, the nonvolatile memory transistor MT10 may connect a pre-synaptic neuron circuit and a post-synaptic neuron circuit. Such a configuration may be illustrated in a form of a circuit in FIG. 13.

Figure 13:
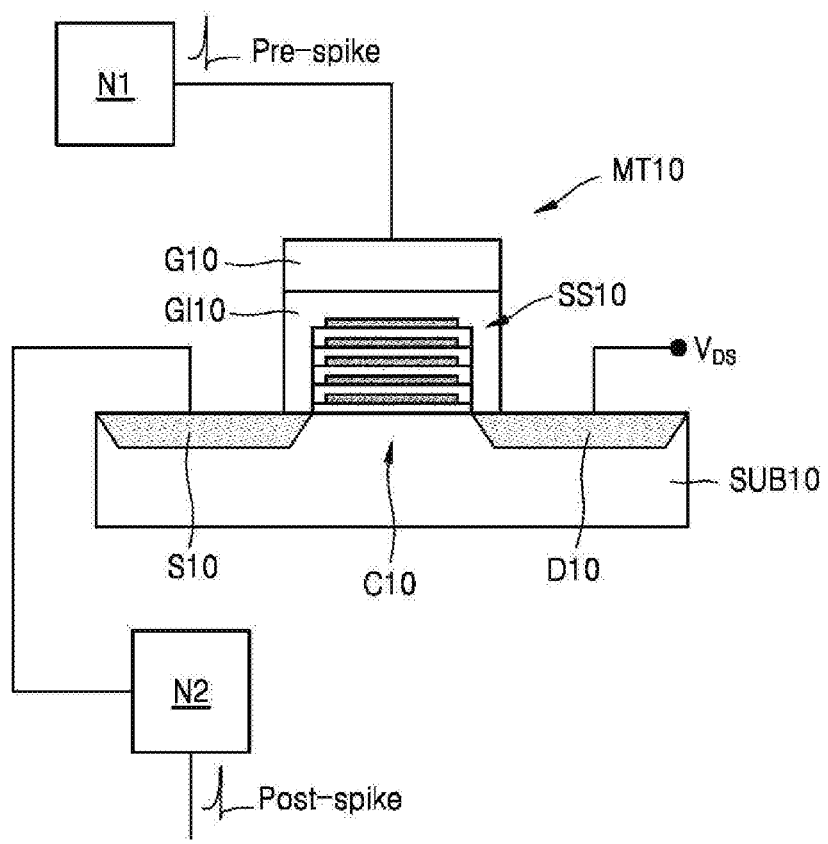
FIG. 13 is a cross-sectional view of a synapse device including a nonvolatile memory transistor, according to an embodiment.

Referring to FIG. 13, the gate electrode G10 of the nonvolatile memory transistor MT10 may be connected to a pre-synaptic neuron circuit N1. The source S10 of the nonvolatile memory transistor MT10 may be connected to a post-synaptic neuron circuit N2. A pre-spike signal may be applied from the pre-synaptic neuron circuit N1 to the gate electrode G10. A post-synaptic current may flow toward the post-synaptic neuron circuit N2 via the source S10. The post-synaptic neuron circuit N2 may generate a post-spike signal. A certain voltage $V_{DS}$ may be constantly applied to the drain D10 of the nonvolatile memory transistor MT10. In other words, the certain constant voltage $V_{DS}$ may be applied to the drain D10.

As the pre-spike signal is repeatedly applied to the gate electrode G10, the threshold voltage of the nonvolatile memory transistor MT10 may be changed, and when a change in the threshold voltage exceeds a certain critical point, the nonvolatile memory transistor MT10 may be turned on by the pre-spike signal. At this time, the post-synaptic current may flow toward the post-synaptic neuron circuit N2 via the source S10.

Figure 14:
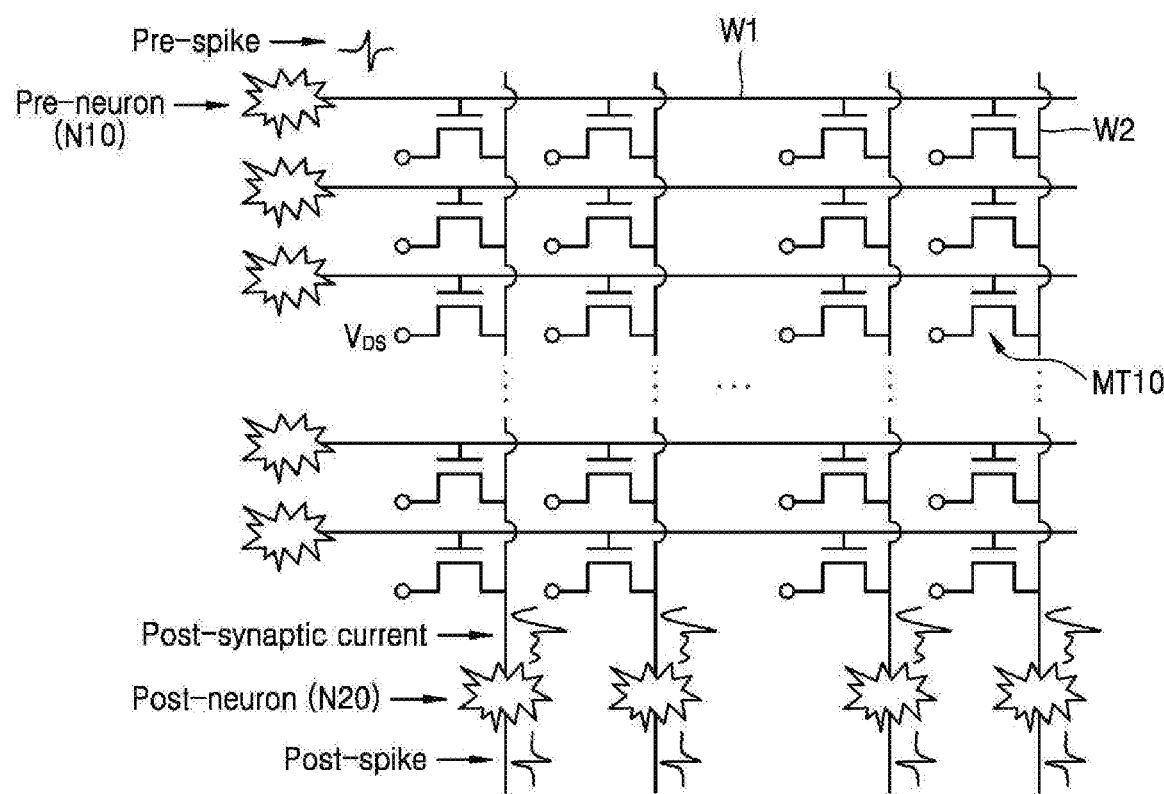
FIG. 14 is a circuit diagram of a synapse array device including a nonvolatile memory transistor, according to an embodiment.

FIG. 14 is a circuit diagram illustrating a synapse array device including a plurality of the nonvolatile memory transistors MT10 according to an embodiment.

Referring to FIG. 14, the plurality of nonvolatile memory transistors MT10 may be arranged in a plurality of rows and a plurality of columns. A plurality of first wirings W1 and a plurality of second wirings W2 may be arranged to cross each other. The nonvolatile memory transistors MT10 may be respectively located at each intersection of the first and second wirings W1 and W2. The first wiring W1 may be connected to the gate electrode of the nonvolatile memory transistor MT10 and the second wiring W2 may be connected to the source of the nonvolatile memory transistor MT10. The first wiring W1 may be connected to a pre-synaptic neuron circuit N10 and the second wiring W2 may be connected to a post-synaptic neuron circuit N20. The certain voltage VDS may be applied to the drain of the nonvolatile memory transistor MT10.

The pre-spike signal may be applied from the pre-synaptic neuron circuit N10 to the gate electrode of the nonvolatile memory transistor MT10 via the first wiring W1. The post-synaptic current may flow toward the post-synaptic neuron circuit N20 via the source of the nonvolatile memory transistor MT10. The post-synaptic neuron circuit N20 may generate the post spike signal.

Figure 15:
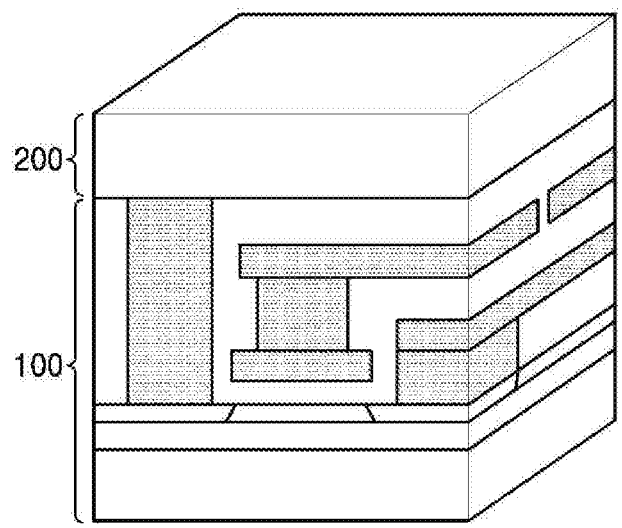
FIG. 15 is a perspective view of a neuromorphic device including a synapse device, according to an embodiment.

FIG. 15 is a perspective view illustrating a neuromorphic device including a synapse device according to an embodiment.

Referring to FIG. 15, the neuromorphic device may include a complementary metal-oxide-semiconductor (CMOS) neuron circuit 100 and a synapse device 200 connected to the CMOS neuron circuit 100. The CMOS neuron circuit 100 may be provided on a certain substrate, for example, an Si substrate. The CMOS neuron circuit 100 may include a pre-synaptic neuron circuit and a post-synaptic neuron circuit. The synapse device 200 may have an array structure according to an embodiment, for example, the array structure of FIG. 14. For convenience of explanation, the synapse device 200 is schematically illustrated. The structure of the neuromorphic device of FIG. 15 is an example and a variety of modifications thereof may be available.

Figure 16:
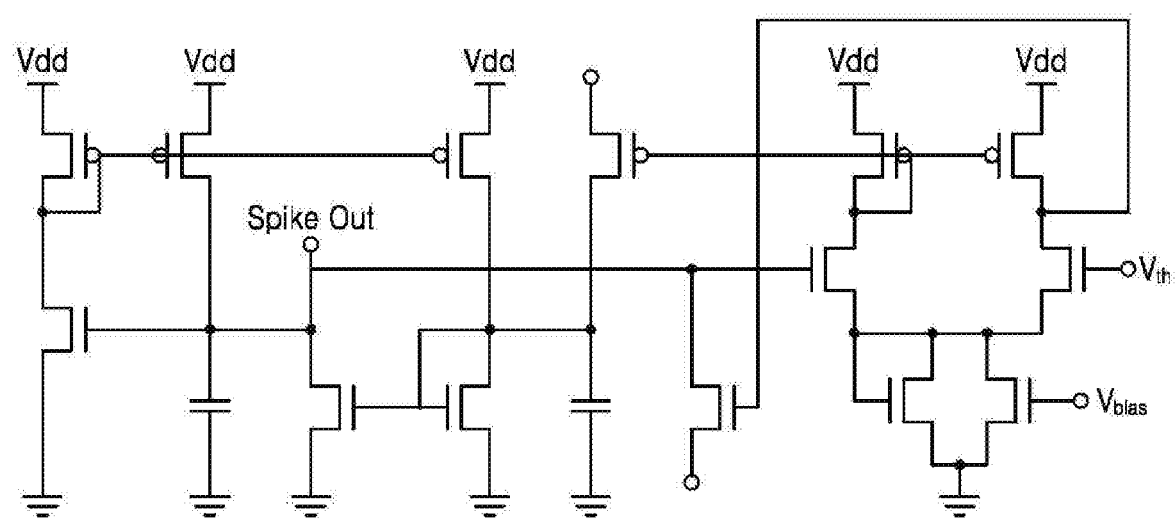
FIG. 16 is a circuit diagram illustrating an example structure of a complementary metal-oxide semiconductor (CMOS) neuron circuit of FIG. 15.

The CMOS neuron circuit 100 of FIG. 15 may have, for example, a circuit structure as illustrated in FIG. 16. The structure of the CMOS neuron circuit 100 is well known, and thus, a detailed description thereof will be omitted herein.

The nonvolatile memory devices (transistors) according to example embodiments may be applied to a variety of electronic devices or logic devices. For example, as described above, the nonvolatile memory devices (transistors) may be applied to the synapse device and the synapse device may be applied to the neuromorphic device. Also, the nonvolatile memory device (transistor) may be applied to a multi-valued logic that simultaneously operates multi-levels with a single unit. In this case, an operation speed may be increased and the size of a device may be reduced. In a circuit structure needing a multi-value, the nonvolatile memory device may be used for a device performing analog computation with hybrid CMOS/multi-value circuits. Also, the nonvolatile memory device (transistor) according to example embodiments may be applied to a circuit or chip having an artificial intelligence function, a circuit or chip operating as a neural network, technology to overcome an information process limit of an existing digital method, a circuit or chip capable of performing a neuron-like operation, a device capable of simultaneously switching and memorizing etc. The nonvolatile memory device according to example embodiments may be applied to all application fields using existing nonvolatile memory devices (transistors).

It should be understood that example embodiments described herein should be considered in a descriptive sense only and not for purposes of limitation. For example, those of ordinary skill in the art to which the present inventive concept pertains would understand that the structure of the nonvolatile memory transistor of FIGS. 1 through 10 may be modified in various ways. In detail, a material other than graphene may be applied to a plurality of charge storage layers, and at least 7 or at least 10 charge storage layers may be used. Also, a Schottky barrier may be used between a channel element and a first charge storage layer instead of a channel barrier layer. Also, a material layer in addition to a charge storage layer and a barrier layer may be further provided between the channel element and a gate electrode, and configurations of the channel element and source/drain may be modified in various ways. Also, the NAND memory structure described with reference to FIG. 11, and the structures of the synapse device described with reference to FIGS. 12 through 16 and the apparatus including the synapse device may be diversely modified as well. Descriptions of features or aspects within each embodiment should typically be considered as available for other similar features or aspects in other embodiments.

What is claimed is:

1. A nonvolatile memory device comprising:
a channel element;
a source and a drain electrically each connected to the channel element. the source and the drain being spaced apart from each other;
a gate electrode facing the channel element;
a storage stack between the channel element and the gate electrode,
the storage stack including a plurality of charge storage layers spaced apart from each other from the channel element towards the gate electrode,
each of the plurality of charge storage layers including a 2-dimensional (2D) material; and
a channel barrier layer between the channel element and the storage stack,
wherein
the nonvolatile memory device is configured to have a multi-bit memory characteristic due to the plurality of charge storage layers,
the storage stack further includes a plurality of interlayer barrier layers alternately provided between the plurality of charge storage layers such that,
each corresponding interlayer barrier layer among the plurality of interlayer barrier layers is between two adjacent charge storage layers among the plurality of charge storage layers, and
each corresponding charge storage layer among the plurality of charge storage layers is between two adjacent interlayer barrier layers among the plurality of interlayer barrier layers,
the plurality of interlayer barrier layers comprise a material having an energy band gap,
the plurality of interlayer barrier layers include a 2D semiconductor or a 2D insulator, and
thicknesses of the plurality of interlayer barrier layers decrease from the channel element towards the gate electrode,
wherein thicknesses of the plurality of charge storage layers increase from the channel element towards the gate electrode.

2. The nonvolatile memory device of claim 1, wherein the plurality of charge storage layers are spaced apart from each other respectively at intervals that decrease from the channel element towards the gate electrode.

3. The nonvolatile memory device of claim 1, further comprising:
a gate insulating layer between the storage stack and the gate electrode.

4. The nonvolatile memory device of claim 1, the multi-bit memory characteristic of the nonvolatile memory device is 3-bit or more.

5. The nonvolatile memory device of claim 1, where the nonvolatile memory device has a vertical-NAND memory structure.

6. A synapse device comprising:
the nonvolatile memory device of claim 1.

7. The synapse device of claim 6, wherein
the synapse device includes a pre-synaptic neuron circuit and a post-synaptic neuron circuit,
the gate electrode of the nonvolatile memory device is connected to the pre-synaptic neuron circuit, and
the source of the nonvolatile memory device is connected to the post-synaptic neuron circuit.

8. The synapse device of claim 6, further comprising:
a plurality of nonvolatile memory devices, wherein
the plurality of nonvolatile memory devices include the nonvolatile memory device and other nonvolatile memory devices corresponding to the nonvolatile memory device, wherein
the plurality of nonvolatile memory devices are arranged in a plurality of rows and a plurality of columns.

9. The synapse device of claim 8, further comprising:
a plurality of first wirings; and
a plurality of second wirings crossing the plurality of first wirings,
wherein the plurality of nonvolatile memory devices are respectively located at intersections of the plurality of first wirings and the plurality of second wirings.

10. The synapse device of claim 9, wherein
the synapse device includes a pre-synaptic neuron circuit and a post-synaptic neuron circuit,
the plurality of first wirings are connected to the pre-synaptic neuron circuit, and
the plurality of second wirings are connected to the post-synaptic neuron circuit.

11. A neuromorphic device comprising:
the synapse device of claim 6.

12. The nonvolatile memory device of claim 1, wherein the plurality of interlayer barrier layers include the 2D semiconductor.

13. The nonvolatile memory device of claim 1, the plurality of interlayer barrier layers include a transition metal dichalcogenide (TMDC) material as the 2D semiconductor.

14. The nonvolatile memory device of claim 1, wherein the plurality of interlayer barrier layers include the 2D insulator.

15. The nonvolatile memory device of claim 1, the plurality of interlayer barrier layers include h-BN as the 2D insulator.

16. The nonvolatile memory device of claim 1, wherein the gate electrode is over the channel element.

17. The nonvolatile memory device of claim 16, further comprising:
a substrate, wherein
the channel element is a region in the substrate between the source and the drain.

18. The nonvolatile memory device of claim 16, further comprising:
a substrate, wherein
the channel element is a channel layer on the substrate.

19. The nonvolatile memory device of claim 1, wherein the 2D material includes graphene.

20. The nonvolatile memory device of claim 19, wherein each of the plurality of charge storage layers includes 1 to 20 layers of graphene.

21. The nonvolatile memory device of claim 1, wherein a dielectric constant of a material of the channel barrier layer is smaller than a dielectric constant of a material of the plurality of interlayer barrier layers in the storage stack.

22. The nonvolatile memory device, of claim 1, wherein the channel barrier layer has a dielectric constant of 6 or higher.

23. The nonvolatile memory device of claim 1, wherein a thickness of the channel barrier layer is greater than a thickness of the interlayer barrier layer.

* * * * *